(12) United States Patent
Etter

(10) Patent No.: US 7,010,118 B2
(45) Date of Patent: Mar. 7, 2006

(54) NOISE COMPENSATION METHODS AND SYSTEMS FOR INCREASING THE CLARITY OF VOICE COMMUNICATIONS

(75) Inventor: Walter Etter, Ocean, NJ (US)

(73) Assignee: Agere Systems, Inc., Allentown, PA (US)

( * ) Notice: Subject to any disclaimer, the term of this patent is extended or adjusted under 35 U.S.C. 154(b) by 600 days.

(21) Appl. No.: 09/956,954

(22) Filed: Sep. 21, 2001

(65) Prior Publication Data

US 2003/0059034 A1 Mar. 27, 2003

(51) Int. Cl.
H04M 1/00 (2006.01)
H04M 9/00 (2006.01)

(52) U.S. Cl. .................................. 379/392.01
(58) Field of Classification Search .............................. 379/406.01–406.16, 391, 392, 392.01, 388.07, 379/416–417, 395; 455/72
See application file for complete search history.

(56) References Cited

U.S. PATENT DOCUMENTS

| | | |
|---|---|---|
| 4,628,526 A | 12/1986 | Germer |
| 5,107,539 A | 4/1992 | Kato et al. |
| 5,509,081 A | 4/1996 | Kuusama |
| 5,524,148 A | 6/1996 | Allen et al. |
| 5,526,419 A | 6/1996 | Allen et al. |
| 5,553,134 A | 9/1996 | Allen et al. |
| 5,909,489 A * | 6/1999 | Matt et al. ............. 379/406.08 |

OTHER PUBLICATIONS

Thomas, I.B. and R.J. Niederjohn, "Enhancement of speech intelligibility at high noise levels by filtering and clipping", J. of the Aud. Eng. Soc. of Am., vol. 16, 1968, pp. 412-415.
Niederjohn, R.J., and J.H. Grotelueschen, "The Enhancement of Speech Intelligibility in High Noise Levels by High-Pass Filtering Followed by Rapid Amplitude Compression,", IEEE Trans. on Acoustice, Speech and Signal Proc., vol. ASSP-24, No. 4, Aug. 1976, pp. 277-282.
Kretsinger, E.A. and N.B. Young, "The use of fast limiting to improve the intelligibility of speech in noise,", Speech Monoger, vol. 27, 1960, pp. 63-69.
Stikvoort, E.F., "Digital dynamic range compressor for audio", J. Audio Eng. Soc., vol. 34, No. 1/2, Jan./Feb. 1986, pp. 3-9.

* cited by examiner

Primary Examiner—Curtis Kuntz
Assistant Examiner—Alexander Jamal

(57) ABSTRACT

The amount of noise compensation applied to a signal is controlled by a system operating as both a noise-adaptive expander and compressor based on far-end and near-end noise level estimates.

29 Claims, 7 Drawing Sheets

NOISE COMPENSATION METHODS AND SYSTEMS FOR INCREASING THE CLARITY OF VOICE COMMUNICATIONS

BACKGROUND OF THE INVENTION

Today, public telephones are easily accessible, but often located in places that are very noisy (e.g., streets, restaurants, train stations, airports, etc . . . ). Given these circumstances, voice communications (e.g., telephone conversations) sometimes become unpleasant and stressful. A noisy environment severely reduces the "intelligibility" (i.e., clarity or understanding) of the words being spoken or heard. The rising popularity of cellular phones, which are also used in noisy environments, increases the need to develop an adequate solution for this problem.

Intelligibility losses due to background noise (sometimes referred to as "ambient" noise) are well known. One solution to reduce the impact of background noise on intelligibility uses a "clipping" technique (see I. B. Thomas, R. J. Niederjohn, "Enhancement of speech intelligibility at high noise levels by filtering and clipping," J. of the *Acoust. Soc. of Am.*, Vol. 16, 1968, pp. 412–415). Although clipping improves intelligibility, it adds distortion to the signal. Alternatively, others have attempted to improve intelligibility using limiters (see E. A. Kretsinger, N. B. Young, *"The use of fast limiting to improve the intelligibility of speech in noise,"* Speech Monogr., vol. 27, 1960, pp. 63–69), high-pass filters, dynamic compression, or some combination of these R. J. Niederjohn, J. H. Grotelueschen, *"The Enhancement of Speech Intelligibility in High Noise Levels by High-Pass Filtering Followed by Rapid Amplitude Compression,"* IEEE Trans. on Acoustics, Speech and Signal Proc., Vol. ASSP-24, No. 4, August 1976, pp. 277–282).

Telephone manufacturers have placed volume controls (e.g., on telephone handsets) in an attempt to solve background noise problems. However, these controls are inconvenient and often ineffective, particularly when they are used in an attempt to compensate for rapidly changing background noise.

Alternatively, automatic compensation techniques have been developed. The process of automatically compensating for background noise—referred to as "noise compensation"—provides significant benefits. Such techniques respond faster to a changing environment. Simple noise compensation methods, also referred to as noise-adaptive automatic level controls, have been used by automotive radio manufacturers for audio reproduction in background noise (see U.S. Pat. No. 4,628,526, "Method And System For Matching The Sound Output Of a Loudspeaker To The Ambient Noise Level" H. Germer), as well as cellular phone manufacturers (see U.S. Pat. No. 5,509,081, "Sound Reproduction System," J. Kuusama). However, these simple automatic level controls do not reduce the dynamic range of an audio signal. Therefore, soft signal portions may get lost among the background noise while loud portions may be too loud for a listener. These effects reduce the overall benefit of such techniques.

Other techniques address the dynamic range problem by incorporating a dynamic compressor. Compressors have been used by audio and telephone manufacturers (see U.S. Pat. No. 5,107,539, "Automatic Sound Volume Controller, Kato, et. al; and E. F. Stikvoort, *"Digital dynamic range compressor for audio,"* J. Audio Eng. Soc., Vol. 34, No. 1/2, January/February 1986, pp. 3–9).

In telephony applications, noise compensation techniques involve automatically compensating for "near-end" (i.e., the location under consideration) background noise by enhancing or "amplifying" a "far-end" (i.e., the location of the other end) signal. Existing compressors have been suggested for applications in both telephone sets (see U.S. Pat. No. 5,553,134, "Background Noise Compensation In a Telephone Set;" J. B. Allen, D. J. Youtkus) and networks (see U.S. Pat. No. 5,524,148, "Background Noise Compensation In a Telephone Network," J. B. Allen, D. J. Youtkus). Such compressors have their limitations, however. Existing compressors are generic versions of audio compressors. Generic audio compressors do not adapt their characteristics to an external input, such as a noise level.

For example, circumstances arise where the level of noise changes from a relatively low level to a relatively high level. Unfortunately, existing compressors do not adapt their operating characteristics in accordance with such changes. This means that sometimes too much or too little compensation is applied to a signal.

Some existing techniques rely solely on the detection of near-end noise levels, failing to account for far-end noise. Such techniques wind up amplifying not only the desired signal but also the noise level contained in such a signal as well. The result is that a desired signal and an undesired signal (e.g., noise) are amplified by the same amount.

Another consideration, related to the "sensitivity" of a handset's microphone (i.e., the output of a microphone at a given sound pressure level), is also commonly overlooked by existing noise compensation techniques. A microphone in a handset picks up speech and background noise. The sensitivity of the microphone affects the estimate of the noise level. Because existing techniques fail to account for the sensitivity of a microphone they cannot provide an accurate amount of compensation. Instead, existing systems provide a level of compensation which may be too low or too high to correctly compensate for noise initially received by the microphone. Typically, existing compressors include a device known as a "noise adaptive gain" controller ("NGC") which is used to provide compensation based on an assumed average sensitivity. If an NGC is providing an incorrect amount of compensation, this error will also cause other parts of the compressor to provide an incorrect amount as well.

When noise compensation techniques are implemented in a network, the problem of "unknown network gain" is added to the problem of inaccurate knowledge of a microphone's sensitivity. For example, a near-end signal may be amplified or attenuated (e.g., by an automatic level control device) before arriving at a location in the network where noise compensation is being carried out. As a result, the electric signal level can no longer be used to derive the sound pressure level at the handset. Existing techniques fail to recognize this problem and, as a result, derive noise level estimates that are often heavily biased which results in too little or too much noise compensation.

Accordingly, more effective noise compensation methods and systems are desirable for increasing the clarity/intelligibility of voice communications.

Other desires will become apparent from the drawings, detailed description of the invention and claims that follow.

SUMMARY OF THE INVENTION

In accordance with the present invention there are provided noise compensation systems and methods that operate as both a "noise-adaptive expander" and "compressor" to increase or decrease an amount of compensation based on both far-end and near-end noise level estimates.

DETAILED DESCRIPTION OF THE INVENTION

The present invention envisions eliminating, reducing or otherwise compensating for (collectively "compensating" or "compensation") noise by applying an amount of compensation based on both near-end and far-end noise level estimates and/or on the near-end sensitivity of a microphone. The amount of compensation is not fixed. Rather, the level of compensation changes as the near-end and/or far-end noise level estimates change.

Figure 1:
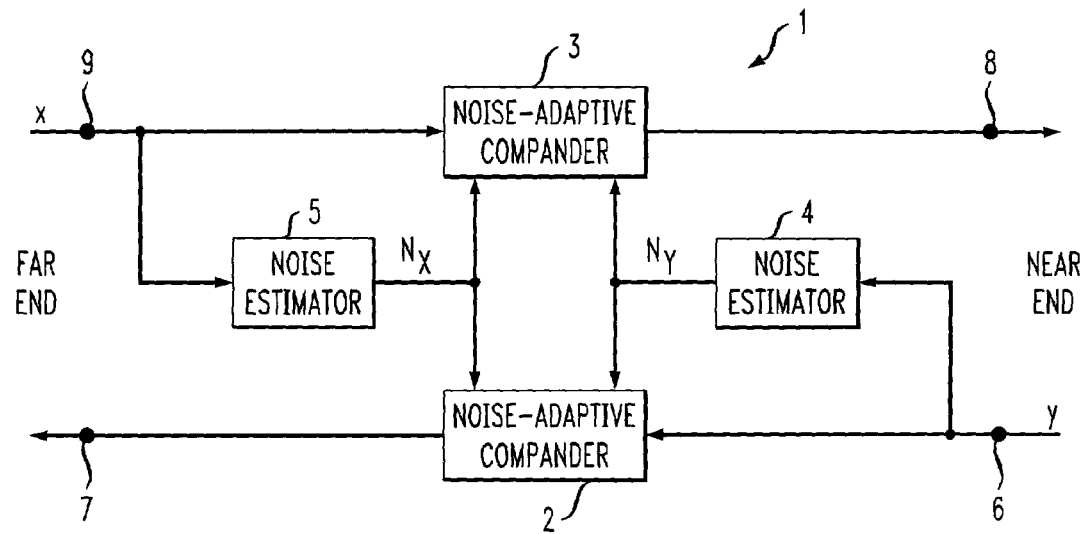
FIG. 1 depicts a simplified block diagram of a noise compensation system according to one embodiment of the present invention.

Referring to FIG. 1, there is shown a simplified block diagram of a "compander" 1 (derived from combining the words compressor and expander) according to one embodiment of the present invention. As illustrated by its very name, compander 1 can be adapted to operate as an expander (i.e., in an expander range/region). Existing devices are not adapted to do so. The compander 1 comprises far-end and near-end compander sections 2,3. In an illustrative embodiment of the invention, the level of compensation applied by the compander 1 to reduce noise is determined by both far-end and near-end noise levels. (denoted by symbols $N_x$ and $N_y$, respectively in FIG. 1). More details concerning noise estimation techniques are discussed in co-pending patent application Ser. No. 09/107,919.

For example, a near-end noise estimator 4 is adapted to detect and estimate the near-end noise levels associated with signals received by a microphone or the like located at near-end position 6. Thereafter, far end compander section 2 is adapted to amplify (i.e., adjust) the signal level of a far-end signal (e.g., via a speaker or the like located at location 7) based on the detected near-end noise level. Similarly, far-end noise estimator 5 is adapted to detect and estimate a far-end noise level of a microphone located at position 9 and, thereafter, near-end compander section 3 is adapted to amplify a signal output to a speaker located at near-end position 8, based on the level detected by estimator 5.

It should be understood that companders, such as compander 1, envisioned by the present invention may be used in a network (e.g., central office) or premises (e.g., in a household telephone). Further, the type of network may be any type that handles voice communications (e.g., telephone company network, Internet Service Provider network, etc . . . ) while the premises may be any type that receives or initiates voice communications (e.g., telephone handset, microphone connected to a personal computer ("PC"), etc . . . ). It should also be understood that a far-end noise estimator may be located at the far-end or near-end provided it is located at substantially the same location as its associated compander section (same for a near-end noise estimator).

Further, though compander 1 is shown comprising two compander sections 2,3 for handling two sets of speakers the present invention also envisions companders which comprise a single compander section. For example, when compander 1 is located within a telephone handset or PC it may only be necessary for the near-end compander section 3 to adjust the near-end loudspeaker located at position 8 based on the near-end and far-end noise levels detected by estimators 4,5.

Further still, though compander 1 is shown comprising noise estimators 4,5 the invention is not so limited. Alternatively, the estimators 4,5 may be separated from the compander 1 such that their outputs are input into compander 1.

Figure 2:
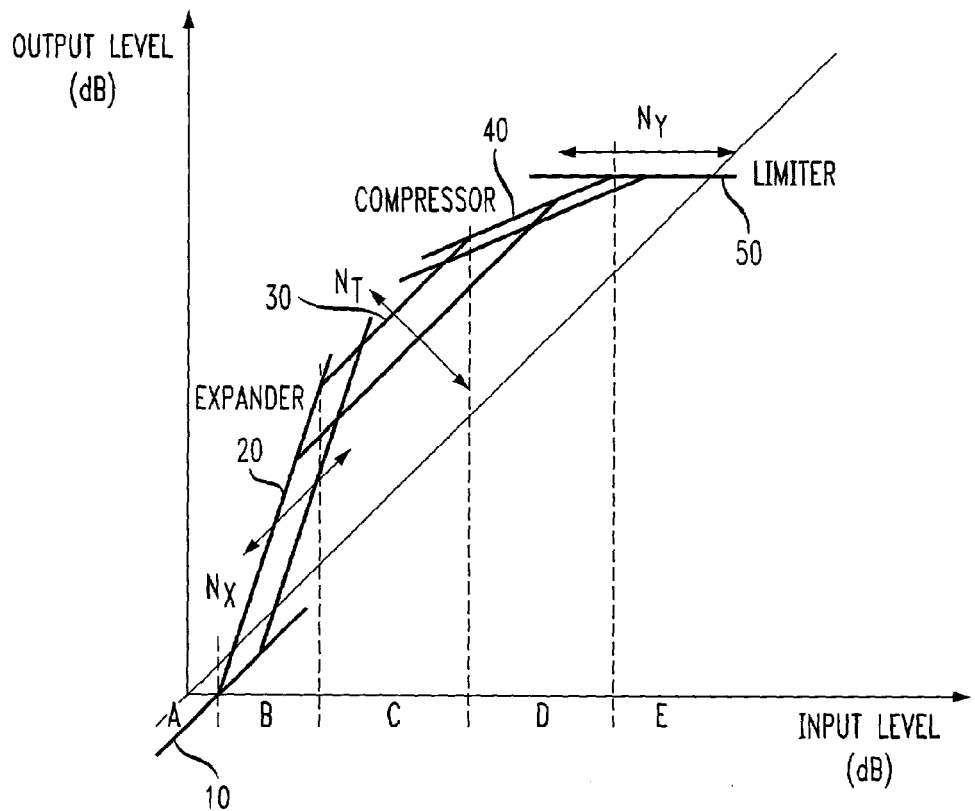
FIG. 2 depicts examples of operational characteristics of the compensation system depicted in FIG. 1 according to embodiments of the present invention.

FIG. 2 shows a curve which illustrates characteristics of compander sections according to one embodiment of the present invention. More specifically, FIG. 2 depicts a curve showing five different ranges, namely: a linear attenuation range 10; an expander amplification range 20 ("expander range"); a linear amplification range 30 ("linear range"); a compressor amplification range 40 ("compressor range"); and a limiter range 50. So it is understood, the characteristics shown in FIG. 2 are for either one of the compander sections 2,3 shown in FIG. 1. For the most part the characteristics of each section 2,3 are substantially the same. To avoid confusion we will refer to each section as a "first" or "second" compander or first or second compander section unless otherwise noted. It should be understood, however, that either the near or far-end compander may be designated as the first or second compander depending upon the point of reference. Though we will primarily focus on the features and functions of the first compander, it should be further noted that the features and functions of the second compander parallel those of the first, and therefore for brevity's sake will not be discussed in detail, the main difference being that the second compander is associated with the opposite end of the network (e.g., far-end v. near-end).

The vertical axis in FIG. 2 represents the level of a signal output from a compander section used to drive an audio speaker or the like while the horizontal axis represents the signal or speech level input into a compander section from a microphone.

It is believed that companders envisioned by the present invention are the first to operate in an expander or expansion range 20 to compensate for noise. In an illustrative embodiment of the present invention, while operating in an expander range a compander is adapted to amplify signals at a near end speaker by an amount which is determined by a far-end noise level, $N_x$. For this and other reasons expanders envisioned by the present invention may be referred to as "noise-adaptive" expanders. As shown in FIG. 2, in the expander range 20, a compander is adapted to amplify relatively low input signal level variations to relatively high, output level variations.

After the input level has exceeded a certain threshold or threshold range, the compander is adapted to operate in a linear amplification mode 30. During this mode of operation, the compander is adapted to apply a linear amount of amplification to the signal. That is, for a given noise level each input signal whose level falls within range 30 in FIG. 2 is amplified by an equal amount.

Once the input level has exceeded a next threshold range, the compander is adapted to operate in a compression or compressor range 40. Once the input level has exceeded a final threshold, companders envisioned by the present invention are adapted to operate in a limiting or limiter range 50. In an illustrative embodiment of the present invention, when companders are operating in either a compression or limiter range they are adapted to apply an amount of amplification determined by a near-end noise level, $N_y$, and a far-end signal level, (e.g., speech).

The curve shown in FIG. 2 is only one example of a set of compander characteristics envisioned by the present invention.

Figure 3:
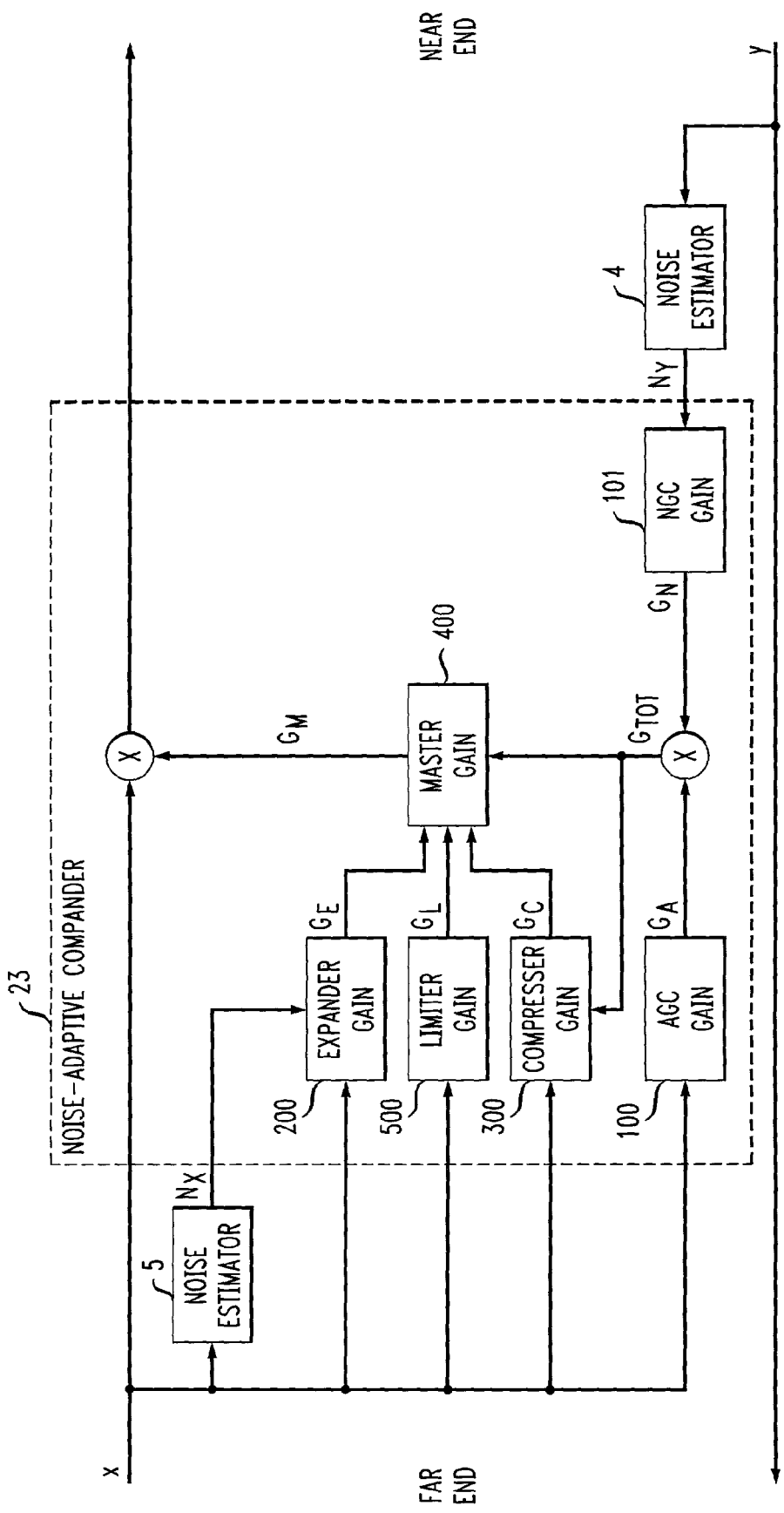
FIG. 3 depicts a simplified block diagram of another noise compensation system according to an embodiment of the present invention.

Referring now to FIG. 3, there is shown a more detailed block diagram of a compander 23 envisioned by the present invention. As shown, compander 23 comprises: expander gain unit 200, compressor gain unit 300, master gain unit 400, limiter gain unit 500, AGC gain unit 100 and NGC gain unit 101. It should be understood that compander 23 may comprise one or two compander sections. One compander section is (i.e., the first compander section) used in FIG. 3 to make the explanation less complicated. Similar to before, we may differentiate units used in one compander section from those in another by designating them as "first" or "second" (e.g., first NGC gain unit verses second NGC gain unit).

In an illustrative embodiment of the present invention the compressor and limiter gain units 300,500 may each comprise a control unit which is adapted to apply an amount of compensation in accordance with the curves shown in FIGS. 4–7. Similarly, the present invention envisions: expander gain unit 200 comprising a control unit adapted to apply compensation levels in accordance with the curves shown in FIG. 8; NGC gain unit 101 comprising a control unit adapted to amplify or adjust near-end signals in accordance with the curves shown in FIG. 9; and an AGC gain unit 100 comprising a control unit adapted to amplify or adjust far-end signals in accordance with the curves shown in FIG. 10. It should be further understood that all of the control units may be combined into one control unit and, further, may comprise one or more programmed media, such as a microprocessor, electronic memory, or the like, which in turn comprises a program or program code (e.g., software or firmware) adapted to carry out the features and functions of the present invention.

The symbols used in FIG. 3 are as follows:
$G_N$: (Linear) Noise-Adaptive Gain
$G_A$: (Linear) Level-Normalizing Gain
$G_L$: Compressor Limiter Gain
$G_E$: Expander Gain
$G_C$: Compressor Gain
$G_{TOT}$: Total Gain, and
$G_M$: Master Gain In an illustrative embodiment of the present invention, the total gain of compander 23 shown in FIG. 3 is calculated as follows:

$$G_{TOT}=G_A \cdot G_N$$

To arrive at the master gain $G_M$, the total gain $G_{TOT}$ is limited by $G_{MAX}$ the maximum allowable total gain, $G_C$, $G_E$, $G_L$, that is, $$G_M=\min\{G_{TOT}, G_{MAX}, G_C, G_E, G_L\}.$$

From this relationship it can be seen that the units making up a compander namely, the compressor, expander and limiter units, all have a similar effect on the noise compensation gain. Each reduces the total gain $G_{TOT}$ for different reasons. The expander unit reduces the total gain to make sure that far-end noise is not amplified as much as far-end speech; the compressor unit reduces the gain to allow a higher total gain in the linear range; while the limiter reduces the total gain to avoid clipping of the far-end signal.

In an illustrative embodiment of the invention, one or more of the units 100,101, and 200–500 may operate according to one or more of the characteristics (i.e., curves) shown in FIGS. 4–10. It should be understood that the curves shown in FIGS. 4–10 may be realized in either hardware, firmware or software.

Figure 4:
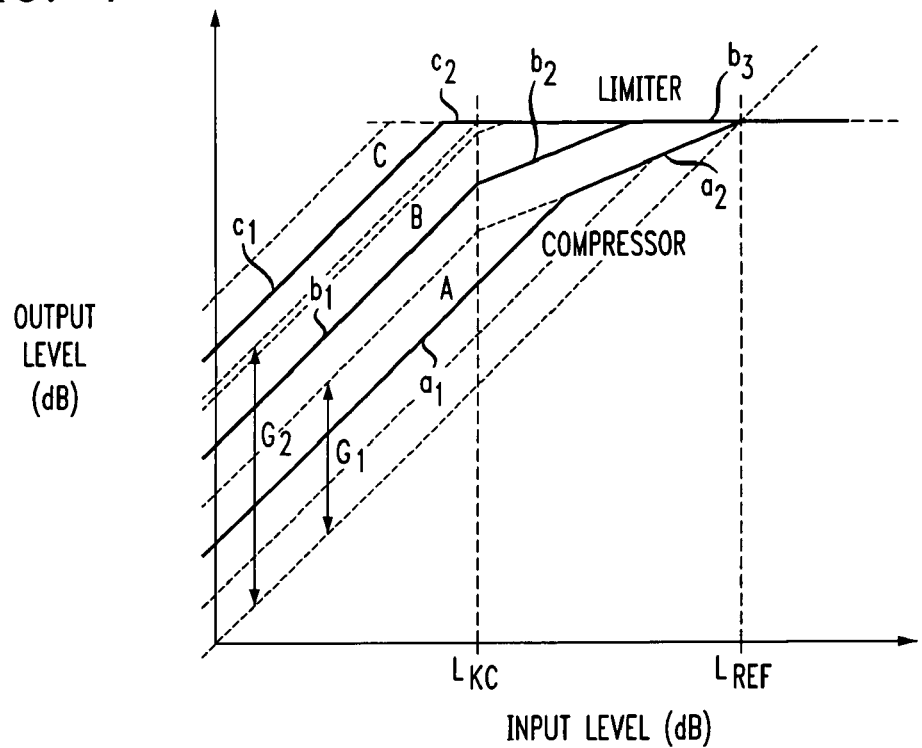
FIG. 4 depicts characteristics of a noise compensation system adapted to operate in an "input-bounded" compression mode according to embodiments of the present invention.

Referring first to FIG. 4, there are shown three different curves, A, B and C. Each curve comprises one or more regions. Curve A comprises a linear region $a_1$ and a compression region $a_2$; curve B comprises a linear region $b_1$, compression region $b_2$ and limiter region $b_3$, while curve C comprises a linear region $c_1$ and limiter region $c_2$. Note that the curves shown in FIG. 4, as well as those shown in FIGS. 5–7, do not comprise an expander region. This is done deliberately. The goal of FIGS. 4–7 is to illustrate the operation of limiter and compressor gain units, not an expander gain unit. These figures help illustrate the fact that companders envisioned by the present invention can be adapted to apply differing (i.e., variable) amounts of compensation based on the noise level detected. That is, each curve A–C is associated with a different noise level (i.e., is used when a specific noise level is detected). More specifically, curve A is associated with a low level of near end noise, curve C with a high level of near-end noise and curve B with a level somewhere in between. The compressor and limiter gain units 300,500 may be adapted to apply noise compensation according to any of the three curves shown on FIG. 4.

It should be understood that three curves are shown for illustration purposes. In reality, the units 300,500 are adapted to apply compensation according to a plurality of compensation curves, each curve being associated with a unique, detected near-end noise level. However, it is practically impossible to show all of the curves envisioned by the present invention. Instead, the present inventors have only attempted to show some of the curves in FIGS. 4–10 which may be used as a guide in understanding the operation of units 100,101,200–500. The present inventors have implemented the curves shown in FIGS. 4–10 by programming a microprocessor to generate an appropriate output level based on a received input level in accordance with the curves shown in FIGS. 4–10.

In existing compressors, the transition to the limiter range is fixed no matter what the noise level. That is, the point at which the compression range begins, and therefore where the limiter range begins, cannot be varied. Not so in the present invention. It can be said that companders envisioned by the present invention are "adaptive" companders because the point at which the compression range begins (the so-called "onset point") can be changed or adapted depending on the circumstances.

Companders operating in accordance with curves A–C in FIG. 4 are said to be operating in an "input-bounded" mode because the transition from the linear range to the compressor range is determined by both an input and an output.

It should be further understood that the compressor and limiter gain units 300,500 may be programmed or otherwise adapted to operate in accordance with one or more of the modes shown in FIGS. 4–7. We have just discussed one mode, that being the input-bounded mode. In general, the compressor and limiter gain units 300,500 may be adapted to select one or more of the modes shown in FIGS. 4–7 or to operate in only one mode.

Viewing FIGS. 3 and 4 together, it can be seen that the near end noise $N_y$, which determines which curve A-C will be used by units 300,500, is not directly detected by units 300,500. Instead, NGC gain unit 101 first receives the near end noise $N_y$ from near end estimator 4. Next, NGC gain unit 101 is adapted to calculate a desired gain in accordance with curves of its own (see FIG. 9, to be discussed later). The resulting gain, $G_N$, from NGC gain unit 101 is multiplied with the gain, $G_A$, from AGC gain unit 100 to form a total gain, $G_{TOT}$. It is this gain which is input into unit 300 which controls which curve will be utilized by units 300,500, and, therefore how much compensation will be applied to a given signal.

The total gain $G_{TOT}$ is input into the compressor gain unit 300 to allow the unit 300 to vary its compressor onset point (again, the point along a curve where a compression range begins) depending upon the total gain $G_{TOT}$. In contrast, in existing systems the total gain $G_{TOT}$ is not provided to the compressor. This has the effect of fixing the onset point. Taking things a step further, because it is possible to vary the compressor onset point it is also possible to vary the limiter range (i.e., where the compression range ends and the limiter range begins). Thus, as a result of providing the total gain to the compressor, the size of the limiter range is now dependent on the total gain $G_{TOT}$. In addition, because the total gain $G_{TOT}$ is derived in part from the near-end noise level, the limiter range is now dependent on the near-end noise level.

The ability to vary the limiter range provides major benefits. These benefits can be demonstrated by contrasting a situation where low near-end noise levels are present to one where high-near-end noise levels are present. For example, when low, near-end noise levels are detected unit 300 can be adapted to operate over a small or substantially non-existent compression range. As a result, the signal involved will not undergo severe dynamic processing which would otherwise degrade the signal quality. For high near-end noise levels the limiter range is large, and as a result, much gain can be provided though the signal quality is degraded. However, in circumstances involving high noise levels, the degradation in signal quality is tolerable because the benefits of realizing higher gains more than outweigh concerns over signal degradation. This trade-off is acceptable because the first priority is to ensure that far-end speech can be understood clearly. In fact, sound alterations due to a large limiter range become irrelevant when far-end speech cannot be understood.

Figure 5:
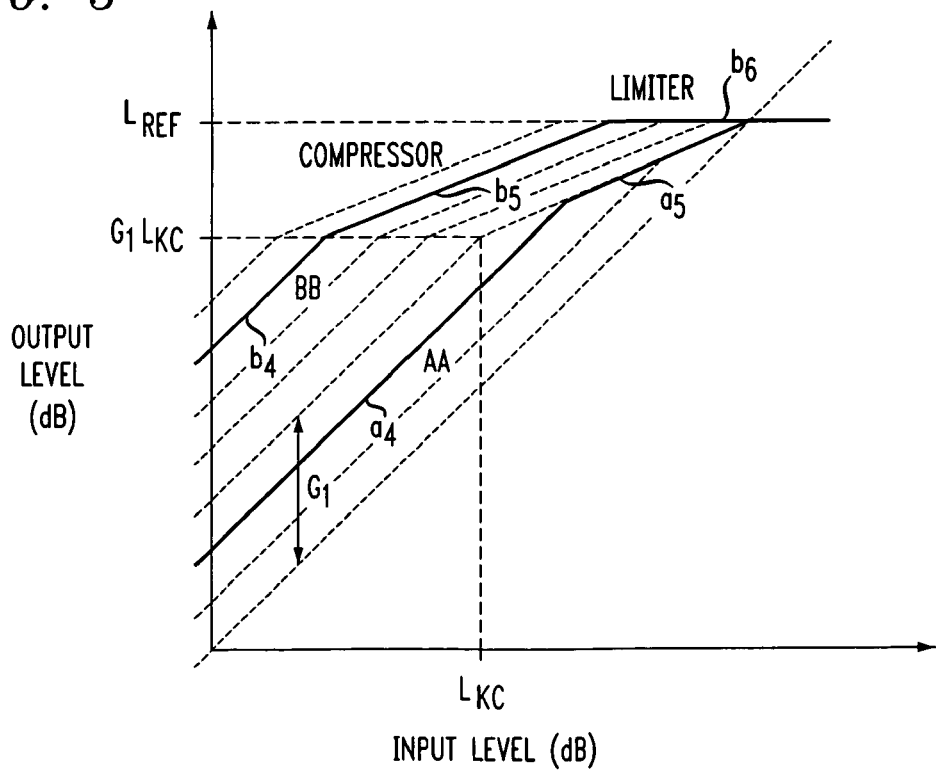
FIG. 5 depicts characteristics of a noise compensation system adapted to operate in an "output-bounded" compression mode according to embodiments of the present invention.
Figure 6:
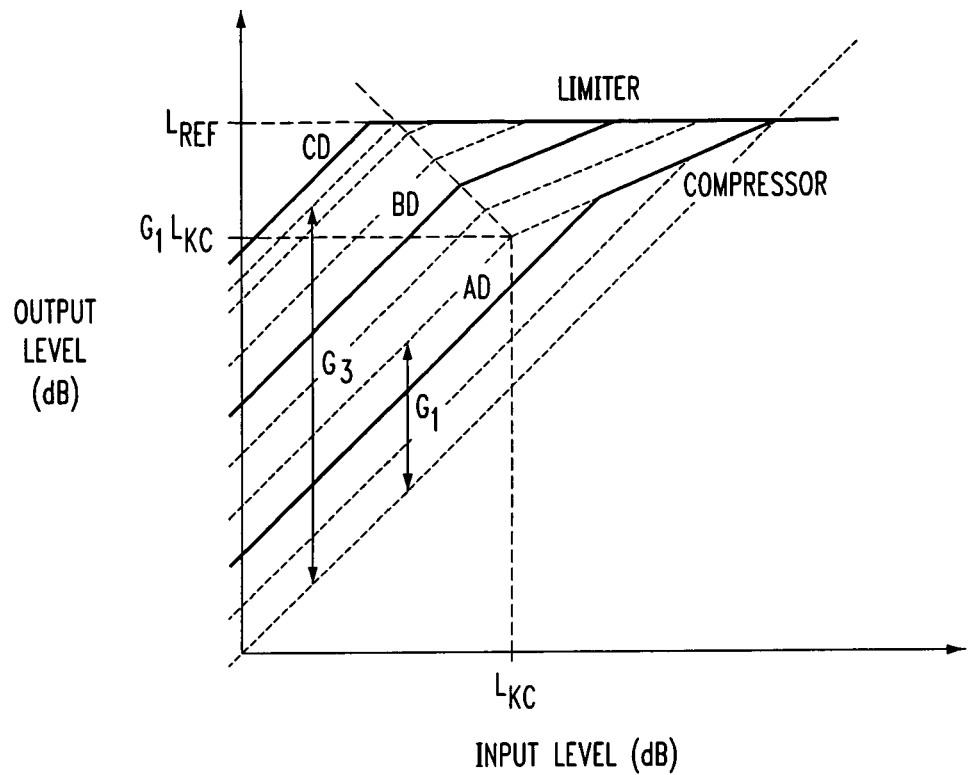
FIG. 6 depicts characteristics of a noise compensation system adapted to operate in an "input-output bounded" compression mode according to embodiments of the present invention.
Figure 7:
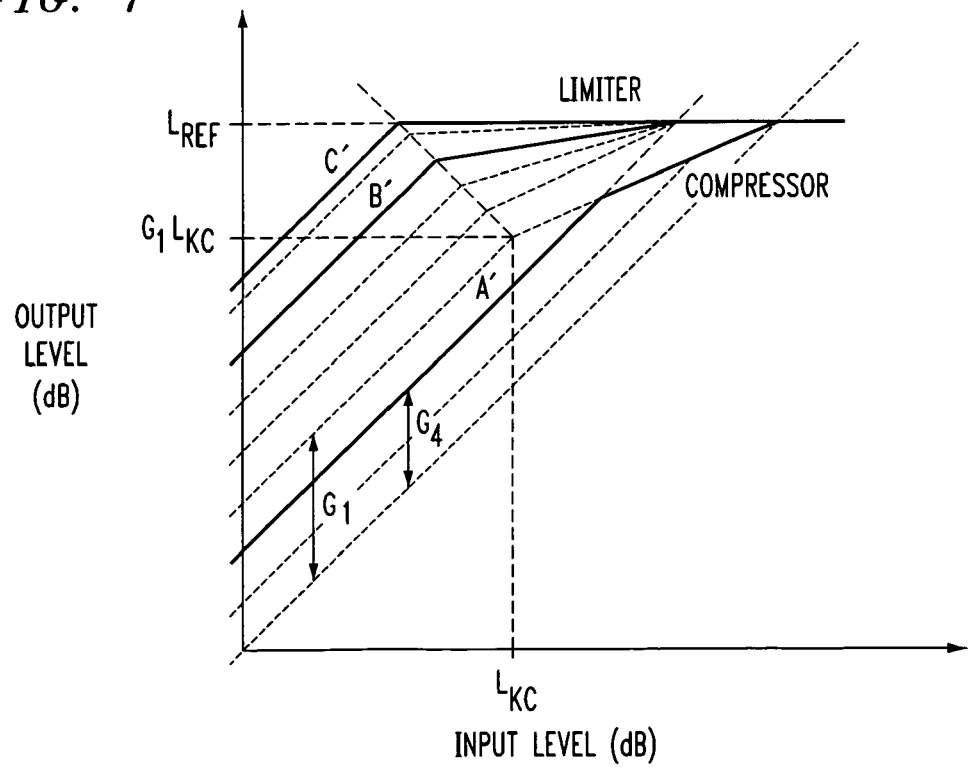
FIG. 7 depicts characteristics of a noise compensation system adapted to operate in an input-output bounded compression mode using variable compression ratios according to embodiments of the present invention.

FIGS. 5–7 depict embodiments of the compressor gain unit 300 and limiter gain unit 500 shown in FIG. 3. More to the point, FIG. 5 depicts curves which may be used by the compressor and limiter gain units 300,500 to operate in an "output-bounded" mode while FIGS. 6–7 depict curves used by units 300,500 to operate in an "input-output-bounded" mode. Like the input-bounded mode illustrated in FIG. 4, the output-bounded mode shown in FIG. 5 comprises a curve ("AA") associated with a linear range $a_4$ and compression range $a_5$ and a curve ("BB") associated with a linear $b_4$, compressor $b_5$, and limiter range $b_6$. Unlike the input-bounded mode, the output-bounded mode does not comprise a linear-limiter curve (curve C shown in FIG. 4). This means that companders operating in accordance with the curves in FIG. 5 are always adapted to operate in a compression range which results in a low amount of noise compensation in high-level noise conditions.

Referring now to FIG. 6, there are shown curves AD, BD, and CD which illustrate compressor and limiter gain units 300,500 adapted to operate in an input-output bounded mode, where the compressor range is no longer bounded by the input only or the output only (i.e., when the near-end noise level varies, the compression range onset point does not move partially along a vertical line (input-bounded) or along a horizontal line (output-bounded)).

FIG. 7 depicts alternative curves A', B', and C' associated with compressor limiter gain units 300,500 adapted to operate in an input-output bounded mode (similar to FIG. 6). However, unlike the operation of the units operating in accordance with the curves illustrated in FIG. 6, units operating in accordance with the curves shown in FIG. 7 use variable compression ratios. More specifically, companders envisioned by the present invention operating in accordance with the curves shown in FIG. 7 are adapted to apply a variable amount of compression only after a total gain reaches an amount equal to G4≧0. In an illustrative embodiment of the present invention, the compressor and limiter gain units 300,500 may be adapted to operate logarithmically (e.g. a logarithmic-based program). Alternatively, the compressor and limiter gain units 300,500 may further comprise lookup tables adapted to store or otherwise implement the curves shown in FIG. 7.

The decision to choose one of the modes shown in FIGS. 4–7 may be based on many factors. For example, one mode may be selected over another based on signal degradation or based on a maximum achievable compensation gain, which is equivalent to a maximum achievable signal level.

It should be noted that the characteristic curves shown in FIGS. 4–7 depict different transitions from a compression range to a limitation range (more commonly referred to as the "dynamic limitation" range). At little near-end noise (i.e. low gain levels), little or no alteration in dynamic range is desired to preserve the original dynamic characteristics of the signal, while still providing gain up to high input signal levels. A compression ratio in the range of 2 to 3 is a good compromise to achieve this goal. That is, for low gain levels, compression in this range is desirable. For higher gain levels, a higher range can be tolerated. These criteria are basically all met to various degrees by the curves shown in FIGS. 4–7. Input-bounded and input-output bounded compressors are desirable because they provide higher maximum achievable gains at the cost of minimum signal degradations.

Figure 8:
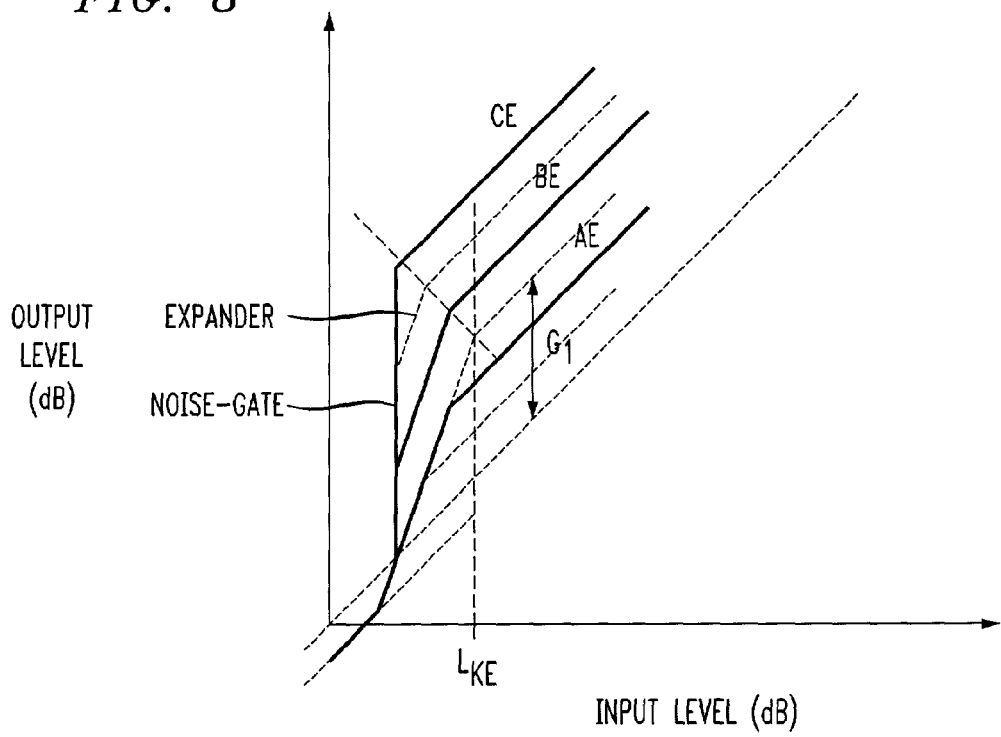
FIG. 8 depicts characteristics of a noise compensation system adapted to operate in an input-output bounded "expander" mode according to embodiments of the present invention.

Up until now we have only lightly touched on the operation of the expander gain unit 200. FIG. 8 depicts curves AE, BE and CE which illustrate the characteristics of an input-output bounded expander for three different noise levels in which the expander gain unit 200 may operate. Said another way, the expander gain unit 200 may be adapted to apply a level of compensation governed by one or more of the curves shown in FIG. 8. Similar to a compressor gain unit, the expander gain unit 200 can be adapted to operate in an input-bounded, output-bounded, or both input-output bounded mode. As before, it is nearly impossible to show all of the curves envisioned by the present invention. The three curves shown in FIG. 8 are for illustrative purposes only.

In yet another embodiment, the expander onset point (that is, the point where expander line 20 in FIG. 2 and linear amplification line 30 intersect) is adapted to the far-end noise level. If the average far-end noise level decreases, the expander onset point is also decreased, and vice versa. This feature of the present invention may be carried out by either compander section. For example, the first compander section may be adapted to reduce the amplification of low level, far-end noise based on a far-end noise level estimate.

So far we have discussed the operation of the expander, limiter and compressor gain units 200,300,500 shown in FIG. 3. We now turn to the AGC and NGC gain units 100,101.

Today, when voice signals are being sent via PCs and other data-based devices in telephony or Internet-based networks (e.g., Internet Service Provider networks), noise compensation requires flexible NGC gain units.

As mentioned in the beginning of this discussion, it is important to know the characteristics of the microphone which is initially being used to detect speech and noise signals in order to correctly set an initial compensation level. More specifically, it is important to know the microphone's sensitivity. For example, some microphones may be designed to pick up less noise from the side. Such microphones will generate underestimates of actual noise levels. In addition, the sensitivity may differ significantly from microphone to microphone. If noise compensation is realized in a network, the sound pressure level at a given handset can no longer be derived from an electric signal level in the network.

Depending on the circumstances, the sound pressure level of near-end noise may be derived accurately from the signal level (for known microphone sensitivities and where noise compensation is integrated into the handset) or may not be derived from the signal level (for unknown microphone sensitivities or where noise compensation is integrated into a network). In cases where it can be derived, NGC gain units envisioned by the present invention can be adapted to operate using a one-to-one relationship as shown in curve "CJ" FIG. 9. NGCs operating in accordance with the characteristics in curve CJ are adapted to generate an amount of compression (i.e., change in compression or gain in dB) which corresponds to the change in noise level.

However, in situations where the sound pressure level of the near-end noise cannot be derived precisely, such a one-to-one noise-to-gain function can lead to a misalignment of compensation/gain and noise. In this situation, only the near-end signal-to-noise ratio gives some indication as to how strong the acoustic near-end noise is. This indication is by no means accurate, however, because a person could be speaking loudly or softly, which changes the signal-to-noise ratio. Clearly, the onset of noise compensation (i.e., the required near-end noise level where noise compensation starts to amplify the far-end signal) cannot be precisely set. That is, the actual noise level may be higher than initially determined, in which case the amount of compensation/gain would turn out to be too low (or vice versa). To account for imprecise near-end noise estimates, the present invention envisions NGCs adapted to operate in accordance with noise-to-gain relationships depicted by curve "EL" in FIG. 9. This curve is characterized by lower noise-to-gain sensitivities. This means that for certain changes in noise, NGCs envisioned by the present invention are adapted to generate lower amounts of compensation/gain changes.

In yet a further embodiment of the present invention, a maximum compensation gain can be attained at levels higher than those shown in curve "EL." In other words, compensation gain is distributed over a wider range of noise levels.

Figure 9:
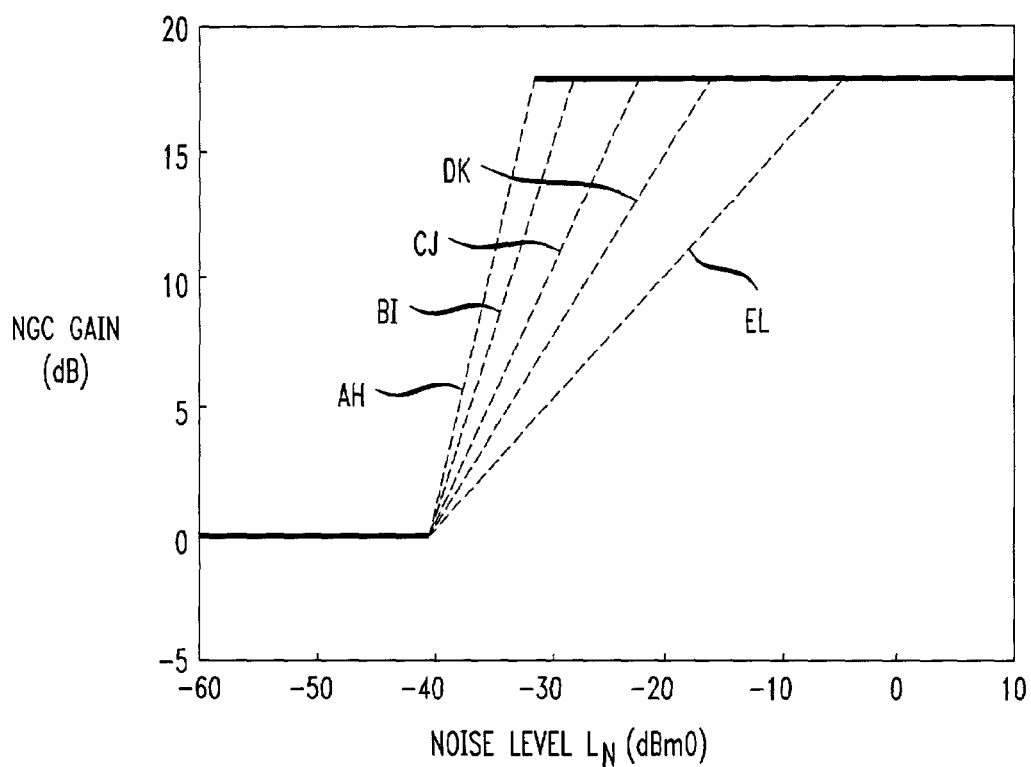
FIG. 9 depicts static characteristics of an NGC unit according to embodiments of the present invention.

The vertical axes of the curves shown in FIG. 9 indicate the gain or level increase of the signal output by NGC unit 101 based on the level of the near-end noise input $N_y$ (i.e., the horizontal axis).

In yet another embodiment of the present invention, when companders envisioned by the present invention detect an increase in a received noise level, they are adapted to produce an increase in gain equal to an amount of $\alpha$ (the so-called "noise sensitivity coefficient") times the noise increase. Companders envisioned by the present invention provide increases in gain between a lower bound ($G_N=1$) and an upper bound ($G_N=G_N^{MAX}$). That is, such companders envisioned by the present invention are adapted to add gain to a received signal given by an amount equal to:

$$G_N = \begin{cases} (L_N/L_0)^\alpha; & \text{if } 1 \le (L_N/L_0)^\alpha \le G_N^{MAX} \\ G_N^{MAX}; & \text{if } (L_N/L_0)^\alpha > G_N^{MAX} \\ 1; & \text{all other times} \end{cases}$$

where $L_0$ represents the noise level of a received signal at which companders envisioned by the present invention are adapted to apply compensation and where the noise sensitivity coefficient is not fixed but variable. For example, when $\alpha=1$, an increase of 1 dB in the noise level results in an increase in gain of 1 dB. In order to accommodate a variety of microphones, the present invention envisions reducing the sensitivity of the gain function given by the equation above by setting a equal to a variable amount less than 1. It should be understood, that the value of a is varied in order to reduce the effect on far-end speech levels that are being modulated by near-end noise in a perceptually objectionable way, or to map a wider range (i.e., dynamic range) of near-end noise levels into a smaller gain range (i.e., dynamic range). The latter is important if the maximum applicable gain is moderate (e.g., in the order of about 10 dB). In sum, compander sections envisioned by the present invention are adapted to amplify far-end signals based on a variable value of $\alpha$.

In one embodiment of the present invention, the NGC gain unit 101 comprises a manual, adjustable switch. Upon listening to a voice signal, the listener can manually adjust the NGC gain unit 101. For example, the listener may manually select one of the curves AH-EL shown in FIG. 9.

Figure 10:
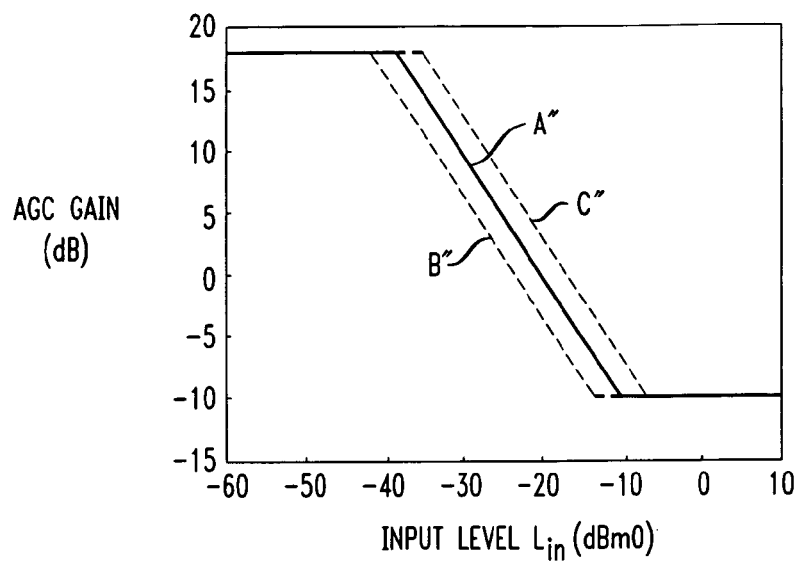
FIG. 10 depicts static characteristics of an automatic gain control ("AGC") unit according to embodiments of the present invention.

Referring now to FIG. 10, there is depicted a curve illustrating the operation of AGC gain units envisioned by the present invention.

In an illustrative embodiment of the invention, an AGC gain unit 100 is adapted to amplify signal levels (e.g., speech and noise) in accordance with the curve shown in FIG. 10. As before, this curve is only an example of the many curves envisioned by the present invention. The solid line "A"" shows a nominal gain while the dashed lines "B", C"" represent the curve's hysteresis.

Referring back to FIG. 3, it can be seen that the total gain $G_{TOT}$, is generated by multiplying the gain $G_N$ generated by NGC gain unit 101 with the gain $G_A$ generated by AGC gain unit 100.

Figure 11:
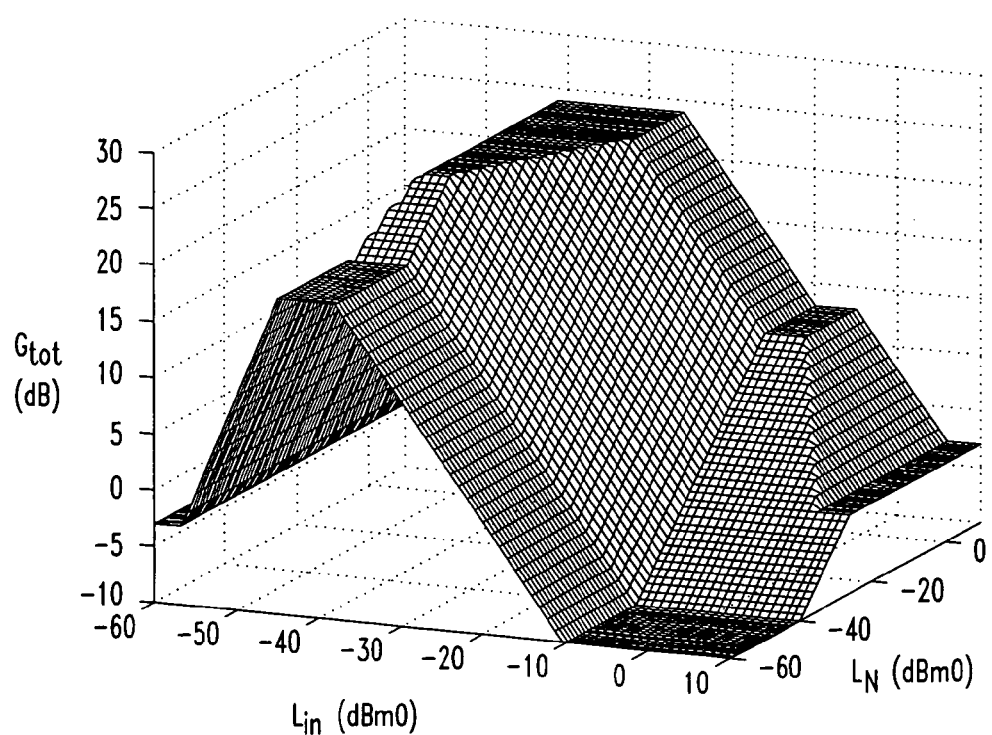
FIG. 11 depicts a three-dimensional graph of the overall gain of a noise compensation system according to one embodiment of the present invention.

FIG. 11 depicts a three dimensional graph of the overall static characteristics of AGC gain unit 100, NGC gain unit 101, expander gain unit 200, limiter gain unit 500 and compressor gain unit 300. These characteristics are shown as a function of the signal level (vertical) and near-end noise level (horizontal axis).

Figure 12:
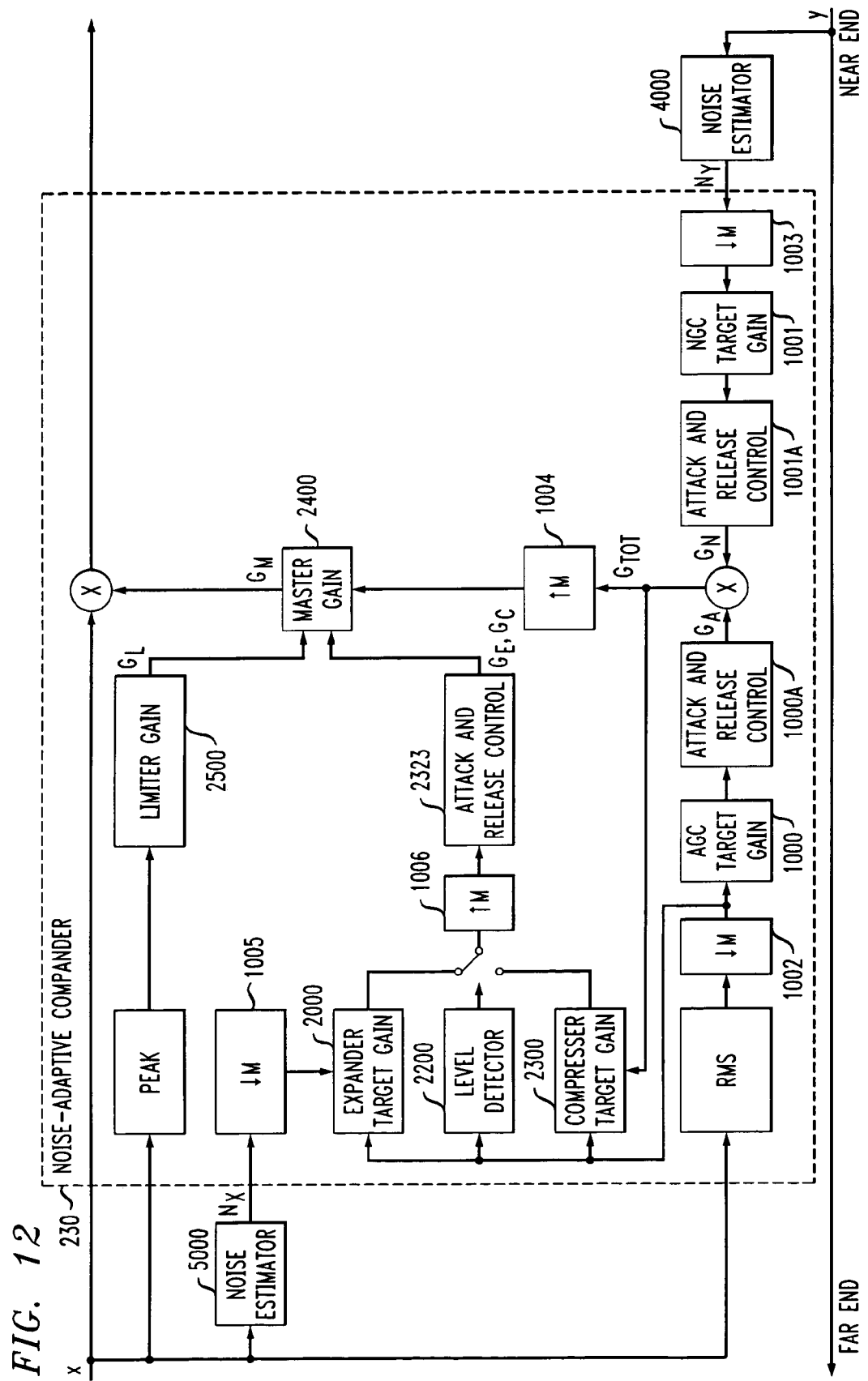
FIG. 12 depicts another block diagram of a noise compensation system according to yet another embodiment of the present invention.

FIG. 12 shows a block diagram of a compander 230 according to yet another embodiment of the present invention.

The compander 230 comprises similar components as the compander 23 in FIG. 3. For example, compander 230 comprises both near- and far-end noise estimators 4000, 5000, an AGC gain unit 1000, an NGC gain unit 1001, expander, compressor and limiter gain units 2000,2300,2500 along with a master gain unit 2400. In addition, compander 230 is shown comprising "attack and release" control units 1000A, 1001A and 2323. It should be understood that the units 100,101,200,300,–500 shown in FIG. 3 also comprise attack and release control units but, to simplify the explanation above, these units were not split up into their static and dynamic components/elements. That said, the compander 230 shown in FIG. 12 is somewhat different than compander 23 shown in FIG. 3. For one thing, attack and release control unit 2323 is associated with both the expander and compressor gain units 2000, 2300. As envisioned by the present invention, the compander 23 shown in FIG. 3 would necessarily use separate attack and release control units for each of the expander and compressor gain units 200, 300. Using the same control unit reduces the amount of computation (i.e., time) needed to generate the right amount (i.e., level) of amplification/gain.

Control units 1000A,1001A are associated with the AGC gain unit 1000 and NGC 1001, respectively. In an illustrative embodiment of the present invention, units 1001,1001A are adapted to "smooth" the outputs from the AGC and NGC units. As envisioned by the present invention, both the AGC and NGC gain units 1000,1001 are only operational when either a near-end or far-end signal changes.

Compander 230 also comprises a number of sampling units designated by those blocks labeled with an "↓ M" or "↑ M". Of the five sampling units 1002–1006 shown in FIG. 12, three are down samplers 1002,1003,1005, and two are up samplers 1004,1006. In an illustrative embodiment of the present invention, the down samplers 1002,1003,1005 are adapted to generate a gain value during every M-th sampling period as opposed to during each sampling period as is done in existing systems. In contrast, up samplers 1004, 1006 are adapted to generate at least one gain value during each sampling period. For example, the limiter gain unit 2500 and master gain unit 2400 are adapted to operate during every sampling period (e.g., at a rate of $f_s$=8 kHz). Other units such as the AGC and NGC gain units 1000,1001 are adapted to operate at a sub-sampling rate (e.g., at a rate which is less than 8 kHz, for example, at 200 Hz or every five milliseconds).

The ability to reduce the number of times that a gain value is generated allows the compander 230 to consume less computation time.

The discussion above includes examples which may be used to carry out the features and functions of the present invention. It should be understood that variations may be made by those skilled in the art without departing from the spirit and scope of the present invention as defined by the claims which follow.

We claim:

1. A system for noise compensation comprising:
   a near-end noise level estimator receiving a near-end signal and generating a near-end noise level estimate based on the near-end signal; and
   a first noise adaptive compander comprising:
      a first input for receiving a far-end signal;
      a second input for receiving the near-end noise level estimate;
      a first output for producing a near-end noise compensated output signal; and
      a noise adaptive gain controller for generating a noise adaptive gain $G_N$ that is a function of the near-end noise level estimate and a noise sensitivity coefficient, the noise sensitivity coefficient is set to a variable value to account for variability in the near-end noise level estimate resulting from imprecise measurement of the near-end noise, whereby the first noise adaptive compander receiving the far-end signal at the first input and receiving the near-end noise level estimate at the second input, the first noise-adaptive compander operating to adjustably amplify the far-end signal based upon the noise adaptive gain $G_N$ to produce the near-end noise compensated output signal at the first output.

2. The system of claim 1 wherein the near-end signal comprises an information signal and a noise signal, the noise signal inaccurately representing the near-end noise.

3. The system of claim 1 wherein the noise adaptive gain function has a lower bound, a maximum upper bound, and a gain between the lower bound and the upper bound that is a function of the near-end noise level estimate and the noise sensitivity coefficient.

4. The system of claim 1 further comprises:
   an adjustable switch allowing a listener to manually adjust the noise adaptive gain controller to select a noise-to-gain relationship as a matter of personal preference.

5. The system of claim 1 further comprises:
   a master gain unit for applying a master gain $G_M$ to the far-end signal, the master gain adjusted by the noise adaptive gain $G_N$.

6. The system of claim 5 wherein the master gain $G_M$ is adapted to adjust the far-end signal based on the noise adaptive gain $G_N$ and a compressor gain $G_C$, the compressor gain $G_C$ based on the noise adaptive gain $G_N$.

7. The system of claim 5 wherein the master gain $G_M$ is adapted to adjust the far-end signal based on the noise adaptive gain $G_N$, a level-normalizing gain $G_A$, a maximum gain $G_{MAX}$, a compressor gain $G_C$, an expander gain $G_E$, and a limiter gain $G_L$ according to the function $G_M=\min\{G_N*G_A, G_{MAX}, G_C, G_E, G_L\}$.

8. The system of claim 1 further comprises:
   a compressor gain control unit for generating a compression gain that is a function of the noise adaptive gain.

9. The system of claim 8 further comprises:
   a limiter for generating a limiter gain that has a range of operation affected by the compression gain at an onset point of the compression gain and the strength of the compression gain generated by the compressor gain control unit.

10. The system as in claim 1 further comprising:
a far-end noise level estimator which receives the far-end signal and generates a far-end noise level estimate based on the far-end signal; and
wherein the first noise adaptive compander further comprises an expander gain control unit for adaptively expanding the far-end signal, whereby the first noise adaptive compander further operates to adjust the amplification of low level far-end noise based on the far-end noise level estimate.

11. The system as in claim 1 wherein the first noise adaptive compander further operates to vary the far-end signal compression range based on a total gain derived from the near-end noise level estimate and a far-end speech level of the far-end signal.

12. The system as in claim 1 wherein the first noise adaptive compander further comprises:
a noise level threshold value wherein the noise adaptive gain controller (NGC) further operates to adjust the noise adaptive gain based on a ratio of the near-end noise level estimate and the noise level threshold value.

13. The system as in claim 1 wherein the first noise adaptive compander further comprises:
a noise level threshold value wherein the noise adaptive gain controller (NGC) further operates to vary a far-end signal gain based on a ratio of the near-end noise level estimate and the noise level threshold value, wherein the far-end signal gain is between a minimum gain and a maximum gain.

14. The system as in claim 1 further comprising:
a far-end noise level estimator receiving the far-end signal and generating a far-end noise level estimate based on the far-end signal; and
second noise adaptive compander comprising:
a first input for receiving the near-end signal;
a second input for receiving the far-end noise level estimate;
a first output for providing a far-end output signal; and
a compressor gain control unit, wherein the second noise adaptive compander receives the near-end signal at the first input and receives the far-end noise level estimate at the second input, the compressor gain control unit adaptively adjusting a near-end signal compression range based on the far-end noise level estimate to adaptively compress the near-end signal to compensate for noise, whereby the second noise-adaptive compander operates to adjustably amplify the near-end signal based upon the far-end noise level estimate to produce the far-end output signal at the first output.

15. The system as in claim 14 wherein the second noise adaptive compander further comprises an expander gain control unit for adaptively expanding the near-end signal, and further operates to adjust the amplification of low-levels of the near-end signal based on the near-end noise level estimate.

16. The system as in claim 14 wherein the second noise adaptive compander further operates to vary the near-end signal compression range based on a total gain derived from the far-end noise level estimate and a near-end speech level of the near-end signal.

17. The system as in claim 14 wherein the second noise adaptive compander further comprises:
a noise level threshold value; and
a noise adaptive gain controller (NGC) adapted to vary a near-end signal gain based on a ratio of the far-end noise level estimate and the noise level threshold value.

18. The system as in claim 14 wherein the second noise adaptive compander further comprises:
a noise level threshold value; and
a noise adaptive gain controller (NGC) adapted to vary a near-end signal gain based on a ratio of the far-end noise level estimate and the noise level threshold value, wherein the near-end signal gain is between a minimum gain and a maximum gain.

19. A method of compensating for noise comprising:
receiving a near-end noise level estimate of a near-end signal in a compander,
receiving a far-end signal in the compander, the far-end signal to be adaptively amplified to compensate for noise;
setting a noise sensitivity coefficient to a variable amount to account for the near-end noise level estimate having an imprecise representation of the near-end noise;
generating a noise adaptive gain in a noise adaptive gain controller, the noise adaptive gain a function of the near-end noise level estimate and the noise sensitivity coefficient;
amplifying the far-end signal based on the near-end noise level estimate and the noise sensitivity coefficient.

20. The method as in claim 19 further comprising:
receiving a far-end noise level estimate of the far-end signal;
adjusting a far-end signal expansion range of the compander based on the far-end noise level estimate; and
varying the amplification of low level far-end noise in the far-end signal expansion range based on the far-end noise level estimate.

21. The method as in claim 19 further comprising varying the far-end signal compression range based on a total gain derived from the near-end noise level estimate and a far-end speech level of the far-end signal.

22. The method as in claim 19 further comprising:
setting a first noise threshold value; and
varying a far-end signal gain based on the near-end noise level estimate and the first noise level threshold value.

23. The method as in claim 19 further comprising:
setting a first noise threshold value; and
varying a far-end signal gain based on the near-end noise level estimate and the first noise level threshold value, wherein the far-end signal gain is between a minimum gain and a maximum gain.

24. The method as in claim 19 further comprising:
receiving a far-end noise level estimate of a far-end signal in a second compander;
receiving the near-end signal in the second compander, the near-end signal to be noise adaptively amplified to compensate for noise;
adjusting a near-end signal compression range of the second compander based on the far-end noise level estimate; and
amplifying the near end signal in the near-end signal compression range.

25. The method as in claim 24 further comprising:
adjusting a near-end signal expansion range of the compander based on the near-end noise level estimate; and
varying the amplification of low-level near-end noise in the near-end signal expansion range based on the near-end noise level estimate.

26. The method as in claim 24 further comprising varying the near-end signal compression range based on a total gain derived from the far-end noise level estimate and near-end speech level of the near-end signal.

27. The method as in claim 24 further comprising:
setting a second noise threshold value; and
varying a near-end signal gain based on the far-end noise level estimate and the second noise level threshold value.

28. The method as in claim 24 further comprising:
setting a second noise threshold value; and
varying a near-end signal gain based on the far-end noise level estimate and the second noise level threshold, wherein the near-end signal gain is between a minimum gain and a maximum gain.

29. A system for noise compensation comprising:
a near-end noise level estimator receiving a near-end signal and generating a near-end noise level estimate based on the near-end signal; and
a first noise adaptive compander comprising:
   a first input for receiving a far-end signal;
   a second input for receiving the near-end noise level estimate;
   a first output for producing an output signal; and
   a noise adaptive gain controller for generating a noise adaptive gain $G_N$ that is a function of the near-end noise level estimate and a noise sensitivity coefficient, the noise sensitivity coefficient is set to a variable value to account for variability in the near-end noise level estimate resulting from imprecise measurement of the near-end noise, the first noise adaptive compander receiving the far-end signal at the first input and receiving the near-end noise level estimate at the second input, the first noise-adaptive compander operating to apply the noise adaptive gain $G_N$ to the far-end signal to compensate the output signal at the first output for near end noise.

* * * * *